(12) United States Patent
Gonzales et al.

(10) Patent No.: US 8,084,994 B2
(45) Date of Patent: Dec. 27, 2011

(54) SYSTEM TO EXTEND THE SERVICE LIFE OF PORTABLE DEVICES

(75) Inventors: Cesar A. Gonzales, Katonah, NY (US); Genady Grabarnik, Scarsdale, NY (US); Lev Kozakov, Stamford, CT (US); Larisa Shwartz, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/023,583

(22) Filed: Feb. 9, 2011

(65) Prior Publication Data

US 2011/0127836 A1     Jun. 2, 2011

Related U.S. Application Data

(63) Continuation of application No. 12/105,349, filed on Apr. 18, 2008, now Pat. No. 7,948,211.

(51) Int. Cl.
    *H02J 7/00* (2006.01)
(52) U.S. Cl. .......................... 320/121; 320/116; 320/117
(58) Field of Classification Search .................. 320/121, 320/116, 117
    See application file for complete search history.

(56) References Cited

U.S. PATENT DOCUMENTS

| | | | |
|---|---|---|---|
| 4,297,590 A | 10/1981 | Vail | |
| 5,268,845 A | 12/1993 | Startup et al. | |
| 5,349,668 A * | 9/1994 | Gladstein et al. | 713/340 |
| 5,818,200 A | 10/1998 | Cummings et al. | |
| 5,937,433 A | 8/1999 | Lee et al. | |
| 6,084,382 A | 7/2000 | Hite | |
| 6,498,957 B1 * | 12/2002 | Umetsu | 700/22 |
| 6,509,717 B2 | 1/2003 | Lee | |
| 6,535,959 B1 | 3/2003 | Ramprasad et al. | |
| 6,836,824 B1 | 12/2004 | Mirov et al. | |
| 6,993,668 B2 | 1/2006 | Luick | |

(Continued)

FOREIGN PATENT DOCUMENTS

CN         1536731         10/2004

(Continued)

OTHER PUBLICATIONS

Maxim Integrated Products, Dallas Semiconductor, MAX1782 Advanced Smart Battery-Pack Controller, http://www.maxim-ic.com/quick_view2.cfm/qv_pk/4233, printed on Feb. 27, 2008.

(Continued)

*Primary Examiner* — Edward Tso
*Assistant Examiner* — M'Baye Diao
(74) *Attorney, Agent, or Firm* — Cahn & Samuels, LLP (57) ABSTRACT

A method for extending the service life of a portable device includes monitoring a battery of a portable device; identifying a problem bank; reconfiguring a connection schema for the battery to replace the problem battery bank with at least one spare bank; conditioning or exercising the problem bank; connecting the portable device to a power supply to recharge the problem bank; and reconnecting the recharged or repaired bank according to the connection schema without the at least one spare bank. A method for extending the service life of a portable device includes monitoring power consumption of at least one of the hardware or software of a portable device; and reconfiguring the connection schema of the battery banks to redistribute power consumption of at least one of the hardware or software.

14 Claims, 7 Drawing Sheets

U.S. PATENT DOCUMENTS

| | | |
|---|---|---|
| 7,003,679 B1 | 2/2006 | Lesea et al. |
| 2004/0164706 A1* | 8/2004 | Osborne ................. 320/116 |
| 2004/0263118 A1* | 12/2004 | Breen et al. ............ 320/116 |
| 2006/0143382 A1 | 6/2006 | Damaraju et al. |
| 2007/0252552 A1 | 11/2007 | Walrath |

FOREIGN PATENT DOCUMENTS

| | | |
|---|---|---|
| JP | 07055901 | 3/1995 |

OTHER PUBLICATIONS

Responsible Energy Corporation, Frequently Asked Questions about NiMH and NiCD Battery Chargers, http://www.greenbatteries.com/bachfa.html, printed on Feb. 27, 2008.

Rana, O. F., "Panel Report: Is it feasible to build effective multi-vendor autonomic computing systems?", 2rd IEEE International Conference on Autonomic Computing (ICAC 2006).

Actel Corporation, "Smart Battery Management Applications," pp. 1-3, Jun. 2006.

SpringerLink, http://www.springerlink.com/content/nk1ehu74we49rwku, printed on Feb. 27, 2008.

Givargis, Tony D., et al., "Evaluating Power Consumption of Parameterized Cache and Bus Architectures in System-on-a-Chip Designs," IEE Transactions on Very Large Scale Integration (VLSI) Systems, vol. 9, No. 4, pp. 500-508, Aug. 2001.

Maro, Roberto, et al., "Dynamically Reconfiguring Processor Resources to Reduce Power Consumption in High Performance Processors," pp. 1-9.

Kephart, Jeffrey O., et al., "Coordinating Multiple Autonomic Managers to Achieve Specified Power-Performance Tradeoffs," IBM, RC2447 (W0711-150), pp. 1-10, Nov. 19, 2007.

Abstract of 07-055901 JP, http://www19.ipdl.inpit.go.jp/PA1/result/detail/main/wAAAETaaJeDA407055901P.htm, printed on Feb. 27, 2008.

Abstract of CN1536731, http://v3.espacenet.com/textdoc?DB=EPODOC&IDX=CN1536731&F=0, printed on Feb. 25, 2008.

Written Opinion of International Searching Authority dated May 27, 2009.

\* cited by examiner

FIG. 7

SYSTEM TO EXTEND THE SERVICE LIFE OF PORTABLE DEVICES

This application is a continuation application of U.S. Ser. No. 12/105,349 filed on Apr. 18, 2008 in the U.S. Patent and Trademark Office, the entirety of which is incorporated herein by reference.

I. FIELD OF THE INVENTION

This invention relates to a system and methods to extend the service life of a portable device, such as a computer laptop or a battery-based smart device.

II. BACKGROUND OF THE INVENTION

The cost of a battery represents a significant portion (approximately 10%) of the cost of a modern laptop. Chemical reactions inside a battery are responsible for the generation of electric energy, but these reactions become less and less upon charge and discharge, thus degrading the capacity of a battery to hold charge for a prolonged period of time. When the capacity of a battery drops significantly, the battery must be replaced at a significant cost. Thus, it is desirable from a consumer perspective to manufacture batteries with a long life.

Current power management software for laptops and other portable devices are inflexible. There is no unified approach regarding optimization of power consumption. Rather, existing power management approaches are fragmented, focusing on optimization strictly for total power or total time required for operating a portable device with a battery, regardless of the underlying use of the device. There remains a need for an integrated optimization based upon the actual operation of, and work performed by, a portable device.

III. SUMMARY OF THE INVENTION

According to an aspect of the invention, a method is provided for extending the service life of a portable device. A battery of a portable device is monitored. The battery comprises at least two battery banks and at least one spare bank. A problem bank is identified. A connection schema for the battery is reconfigured to replace the problem battery bank with the at least one spare bank. The problem bank is conditioned or exercised. The portable device is connected to a power supply to recharge the problem bank. The recharged or repaired bank is reconnected according to the connection schema without the at least one spare bank. Continued use of the portable device occurs during the conditioning; while maintaining a total charge of the battery.

In another aspect of the invention, a method is provided for redistributing and optimizing power consumption of a portable device. The power consumption of at least one of the hardware or software of a portable device is monitored. The portable device comprises a battery comprising at least two battery banks and at least one spare bank. The connection schema of the battery banks is reconfigured to redistribute power consumption of at least one of the hardware or software.

According to another aspect of the invention, a portable device is provided comprising a battery comprising at least two battery banks and at least one spare bank; a sensor for monitoring the status of the at least two battery banks; and a connecting controller for reconfiguring a connection schema of the battery.

According to another aspect of the invention, a portable device is provided comprising a battery comprising at least two battery banks and at least one spare bank; a sensor for monitoring the status of the at least two battery banks; a connecting controller for reconfiguring a connection schema of the battery to replace a problem bank with a spare bank; and a discharge/exercise controller for controlling the rate of discharge and recharge of the problem bank. The connecting controller comprises a computing resource profile comprising a model based upon at least one of actual usage of the portable device, a required level of power consumption, or a chosen level of power consumption.

In another aspect of the invention, a computer program product is provided comprising a computer useable medium having a computer readable program. When executed on a computer, the computer readable program causes the computer to monitor the power consumption of at least one of the hardware or software of a portable device, the portable device comprising a battery comprising at least two battery banks and at least one spare bank; and reconfigure the connection schema of the battery banks to redistribute power consumption of at least one of the hardware or software.

As used herein "substantially", "relatively", "generally", "about", and "approximately" are relative modifiers intended to indicate permissible variation from the characteristic so modified. They are not intended to be limited to the absolute value or characteristic which it modifies but rather approaching or approximating such a physical or functional characteristic.

In the detailed description, references to "one embodiment", "an embodiment", or "in embodiments" mean that the feature being referred to is included in at least one embodiment of the invention. Moreover, separate references to "one embodiment", "an embodiment", or "in embodiments" do not necessarily refer to the same embodiment; however, neither are such embodiments mutually exclusive, unless so stated, and except as will be readily apparent to those skilled in the art. Thus, the invention can include any variety of combinations and/or integrations of the embodiments described herein.

Given the following enabling description of the drawings, the system and methods should become evident to a person of ordinary skill in the art.

V. DETAILED DESCRIPTION OF THE DRAWINGS

FIGS. 1-7 illustrate a system and methods to extend the service life of a portable device, such as a computer laptop or notebook, or other battery-based smart devices, such as cell phones, MP3 players, TVs, personal digital assistants (PDA), and tools. A smart device comprises a computer chip, module, or system for monitoring and control mechanisms.

An advantage of the present invention is that a battery can serve longer on one charge. This allows a reduction of a carbon footprint by reducing number of batteries needed to be produced and later destroyed. In embodiments, the present invention also provides an integrated optimization of power consumption based upon the actual operation of, and work performed by, a portable device.

A battery for a portable device is typically built using multiple cells or banks connected in series and/or in parallel to provide a desired output voltage and current capacity. In embodiments, the battery banks are rechargeable. According to the present invention the battery banks may include, but are not limited to, at least one of nickel cadmium, nickel metal hydride, lithium, or lead-acid batteries.

According to the present invention, a method for extending the service life of a portable device comprises monitoring at least one of a battery, hardware, or software of a portable device and reconfiguring a connection schema for the battery.

Figure 1:
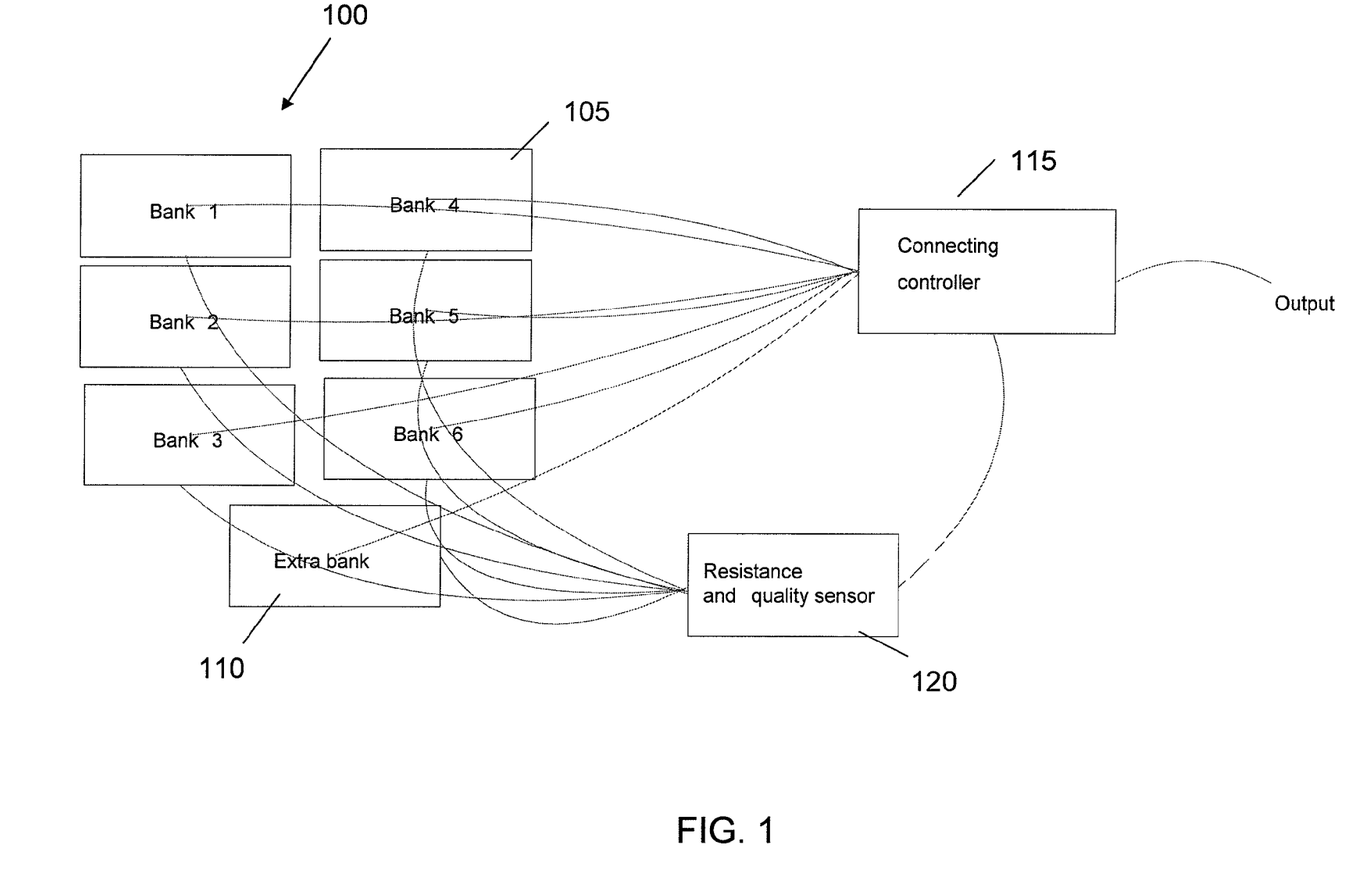
FIG. 1 illustrates monitoring a battery according to an embodiment of the present invention.

As illustrated in FIG. 1, a battery 100 according to the present invention may comprise at least two banks or cells 105, for example, a plurality of banks (e.g., Banks 1-6); at least one extra or spare bank 110; and a connecting controller 115 which analyzes the state of battery banks 105 using a resistance and quality sensor 120. In embodiments, the connecting controller 115 reconfigures the connection schema of the battery banks 105 to replace a low power bank with the extra or spare bank 110 when needed.

In embodiments, the connecting controller 115 may change the connection schema of the battery banks 105 according to a regular predetermined schedule (e.g., periodic intervals) to rotate usage of the battery banks with the spare bank. In embodiments, the connecting controller changes or reconfigures the connection schema based upon the resistance and quality control sensor's 120 monitoring of specific criteria of the battery; for example, monitoring the status of at least one bank for changes in at least one of energy density, charge, capacity, or internal resistance. In this way, the connecting controller 115 ensures stable power output of the whole battery 100 and avoids common causes of battery failures, such as the loss of internal resistance or loss of capacity.

Figure 2:
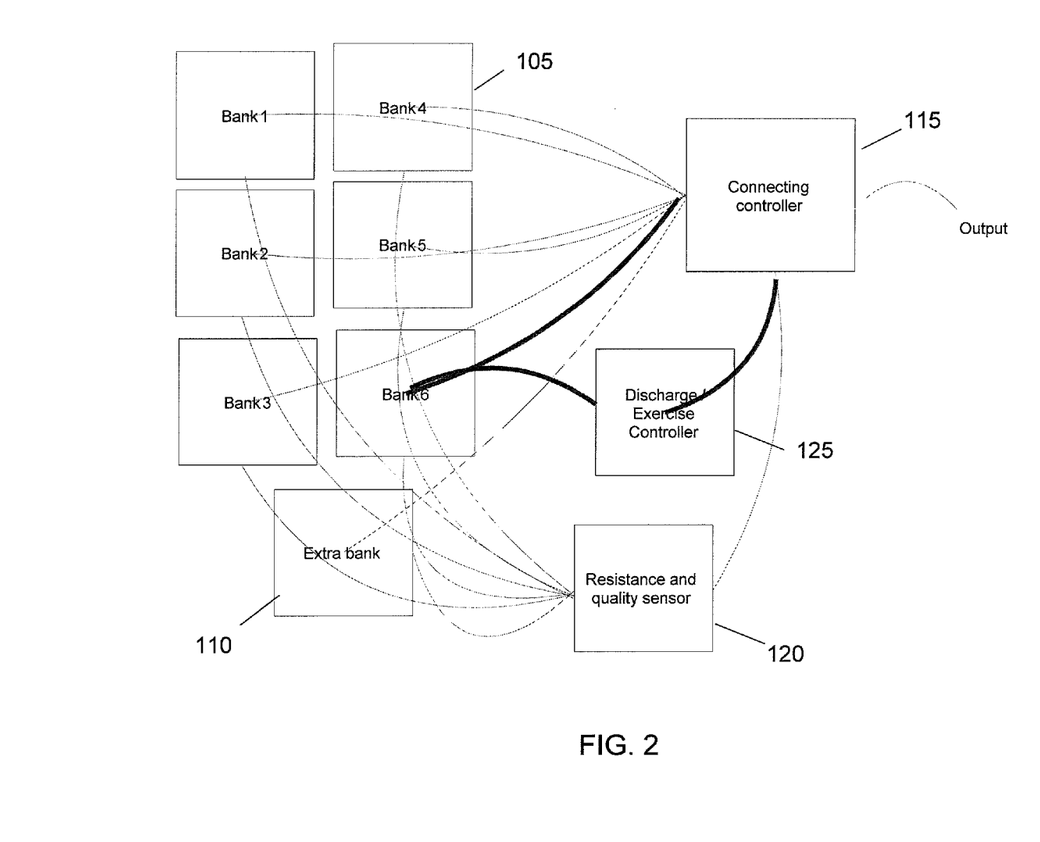
FIG. 2 illustrates reconfiguring the connection schema of a battery to allow for conditioning or exercising of a battery bank according to an embodiment of the present invention.

According to an embodiment of the present invention, as illustrated in FIG. 2, a battery bank may be automatically conditioned or exercised once a problem is identified. As in FIG. 1, the connecting controller 115 monitors the state of the battery banks using the resistance and quality sensor 120. Conditioning or exercising comprises discharging a battery bank to a minimum voltage and then recharging it. Conditioning may be necessary when a bank 105 has a problem with at least one of its energy density, charge, capacity, or internal resistance as compared to a substantially new bank.

When a bank, for example Bank 6, needs to be conditioned/exercised, the connecting controller 115 reconfigures the connection schema to replace the problem bank (Bank 6) with the spare or extra bank 110. The problem bank is connected to a discharge/exercise controller 125 (as shown by bold lines in FIG. 2) that allows for the discharge of the problem bank in a controlled manner. In contrast to known procedures for conditioning batteries, the present invention allows a portable device to continue to be used during conditioning/exercising of a battery bank, while maintaining a total charge of the battery.

When the portable device comprising the battery is connected to a power supply (e.g., an AC power supply), the discharged bank (Bank 6) is automatically recharged, and its function is restored. The connecting controller 115 reconnects the recharged/repaired bank (Bank 6) again according to the main battery connection schema. In embodiments, the discharge/exercise controller 125 controls the rate of discharge and recharge of a battery bank and may subject a battery bank to a cycling of voltage or current to condition/exercise the bank.

In embodiments, a wake up procedure may be utilized if the voltage of a battery bank is too low to permit a full charge. According to the present invention, the connection schema of the banks 105 may be changed to allow for discharging a battery bank in mild discharge sequences, followed by a partial charging. In embodiments, a discharge sequence may be applied to different battery banks. The wake procedure may allow for a resetting of the resistance and quality sensor 120. The wake up procedure is not a complete discharge as in conditioning or exercising of a battery bank.

Figure 3:
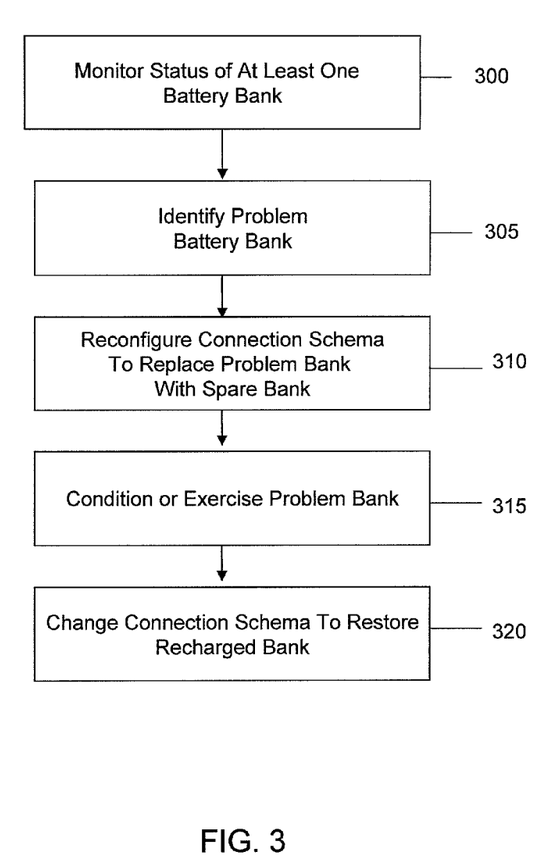
FIG. 3 is a flowchart for a method of extending the service life of a portable device according to an embodiment of the present invention.

The conditioning/exercising method of the present invention is illustrated in the flowchart of FIG. 3. The status of at least one battery bank is monitored 300. A problem battery bank is identified 305. The connection schema of the battery banks is reconfigured to replace a problem bank with at least one spare bank 310. The problem bank is exercised or conditioned 315. The connection schema is changed to reconnect the recharged/repaired bank to the main connection schema 320 without the at least one spare bank. Continued use of the portable device may occur during conditioning/exercising of a battery bank, while maintaining a total charge of the battery.

Figure 4:
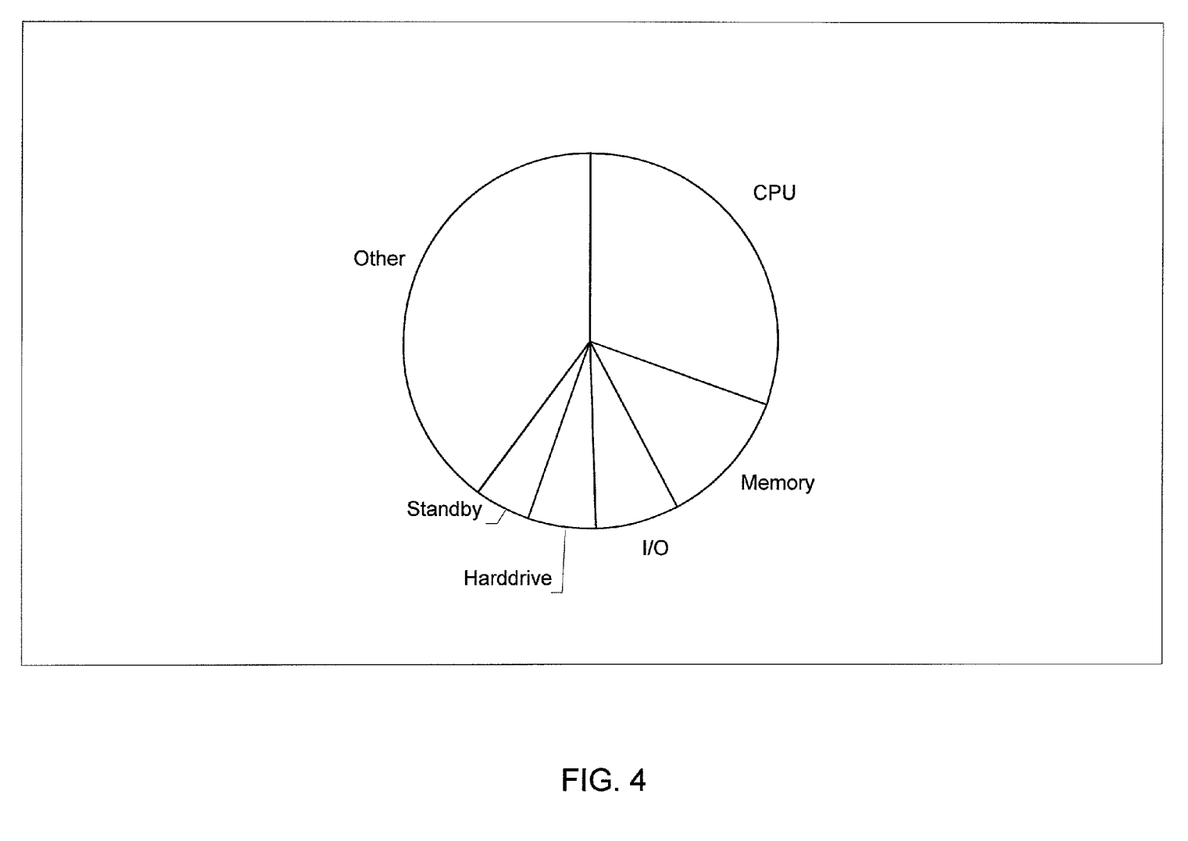
FIG. 4 is a pie chart which illustrates power distribution among different system blocks.

FIG. 4 is a pie chart 400 which illustrates the power consumption for different blocks of a portable device (e.g., CPU, memory, I/O, standby, hard drive). According to an embodiment of the present invention, the connection schema of the battery banks may be reconfigured or changed to redistribute and optimize the power consumption of at least one of the hardware or software of a portable device. Such a reconfiguration may allow not only for reduced power consumption, but also for redistributed and optimized power consumption of a portable device.

The power consumption of at least one of the hardware or software of a portable device may be monitored. To optimize power consumption of the hardware of a portable device, the connecting controller may change the connection schema of the battery banks to dynamically change the level of power consumption of the portable device. The connecting controller monitors the power consumption of at least one of the CPU, hard drive, memory bus, brightness level, peripheral devices, printers, I/O devices, or network adapters.

If necessary, the connecting controller reconfigures the battery banks based upon the level of power consumption to reduce or redistribute the power consumption as necessary and prolong the life of the battery. For example, if a database application requires a significant I/O use, less power may be directed to CPU. Similarly, if a web application requires significant CPU, less power may be used for I/O use. Thus, the connection schema may be reconfigured to use less power from at least one battery banks or may use a spare bank according to the power needs of the hardware of the portable device.

To optimize power consumption of the software of a portable device according to the present invention, the connecting controller monitors power or energy consumption for a software application, for example, monitoring compiling executable code or running a scripting language (e.g., javascript, php). The reconfiguration of the connection schema occurs at the time of running a software application, thereby allowing for just-in-time (JIT) or real-time dynamic changing of the level of power consumption. Accordingly, different software effects may be achieved, for example, having a software application run more quickly or prioritizing the running of scripts.

Figure 5:
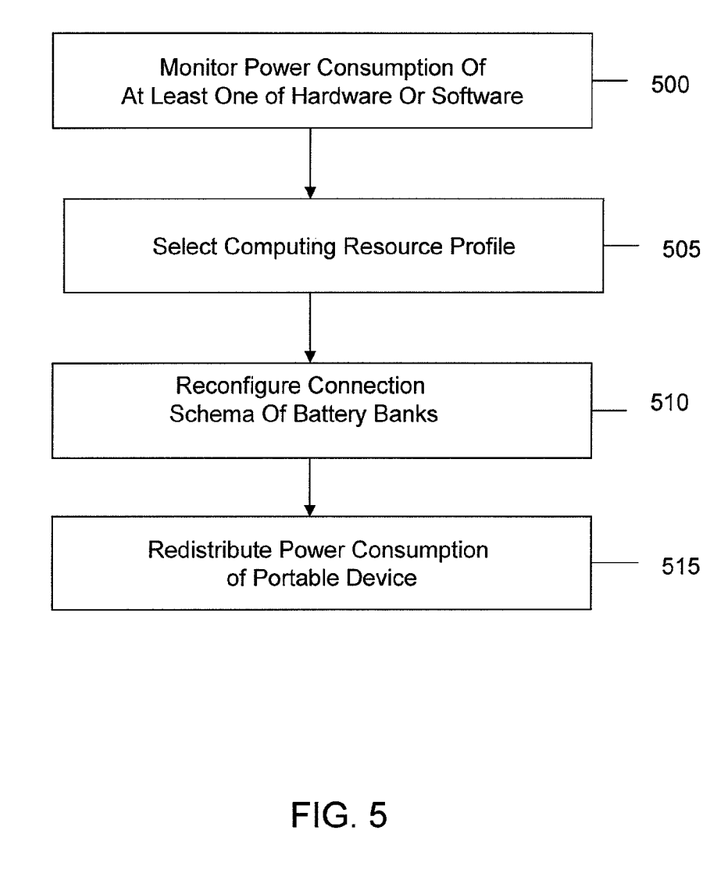
FIG. 5 is a flowchart for a method of extending the service life of a portable device by redistributing power consumption according to an embodiment of the present invention.

According to the present invention, the portable device may have at least one computing resource profile based upon the level of power consumption required, as illustrated in FIG. 5. The power consumption of at least one of the hardware or software of a portable device is monitored 500. Based upon the monitoring, a computing resource profile may be selected 505. The connection schema of the battery banks is reconfigured 510. Accordingly, power consumption is redistributed in an optimized way 515.

In embodiments, a computing resource profile may be stored in the connecting controller. The at least one computing resource profile may be defined based upon various ways in which at least one of the hardware or software may operate, for example, how the hard drive caching is done; how the memory caching is done; how certain CPUs operations are performed; and the like. The computing resource profile comprises a model based upon at least one of actual usage of the portable device; a required level of power consumption; or a chosen (user-selected) level of power consumption. In embodiments, a user may choose a computing resource profile.

In embodiments, once an available power level becomes lower than a threshold, the connecting controller can request to switch to a lower consumption computing resource profile. Automatically switching to a power-saving computing resource profile may also be triggered by other events, such as extensive power demand.

In embodiments, the power consumption of software may be monitored and the software configuration or a software optimization model may be changed based on at least one of a chosen computing resource profile or a chosen level of power consumption.

According to the present invention, the reconfiguration of battery banks based upon a computing resource profile is applicable to a portable device or a server, if the server works on a back-up battery.

Figure 6:
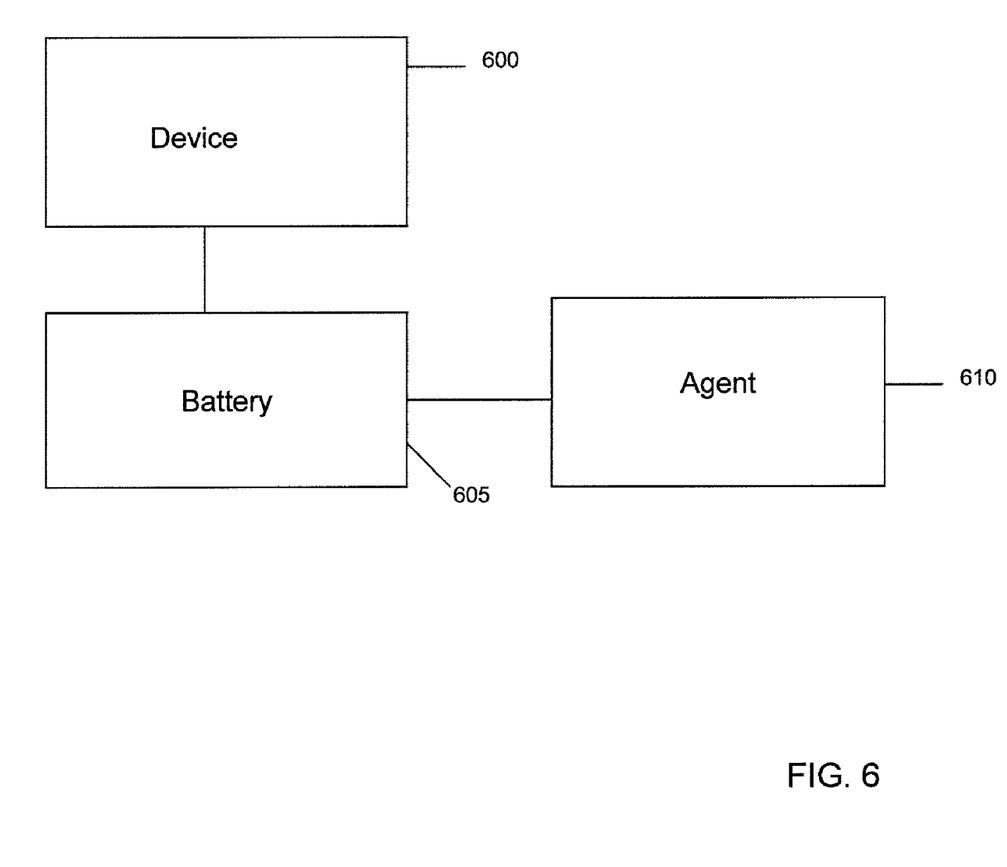
FIG. 6 is a block diagram of a device according to the present invention.

FIG. 6 is a block diagram showing an illustrative device of the invention. The illustrative system includes at least one electronic or digital device 600 (e.g., a personal computer, laptop computer, notebook computer, cellular telephone, personal digital assistant or PDA, game device, MP3 player, television). The device comprises a battery 605 comprising at least two battery banks and at least one spare bank and an agent 610 for reconfiguring the connection schema of the battery banks. The illustrative system is but one example, and one of ordinary skill in the art would recognize that many other variations may exist, all of which are contemplated by the invention.

Figure 7:
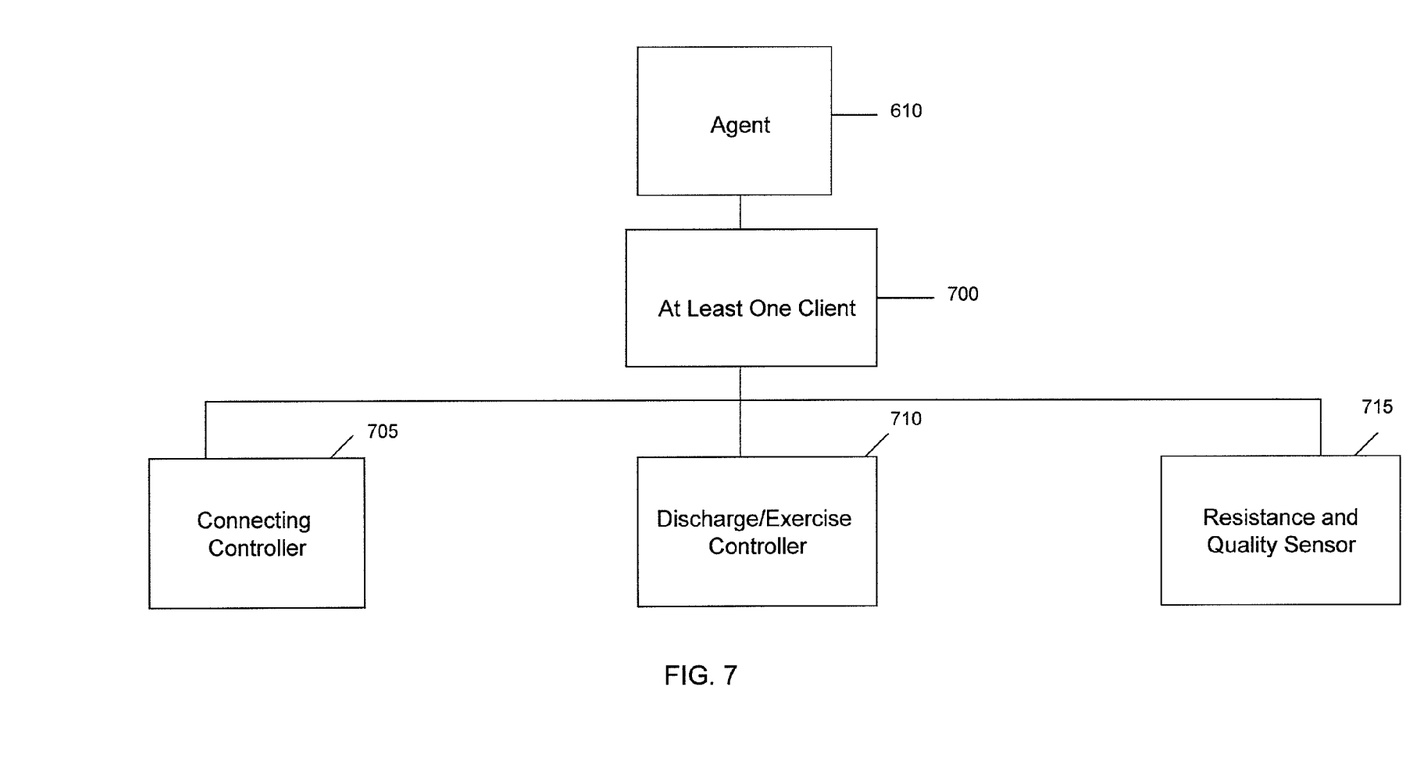
FIG. 7 is a block diagram of an exemplary agent according to an embodiment of the present invention.

FIG. 7 illustrates an exemplary agent 610 of the invention which includes at least one client 700 comprising at least one of a connecting controller 705 for reconfiguring a connection schema of battery banks; a discharge/exercise controller 710 for controlling the rate of discharge and recharge of a bank; or a resistance and quality sensor 715 for monitoring the status of the battery banks.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution. Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Computer program code for carrying out operations of the present invention may be written in a variety of computer programming languages. The program code may be executed entirely on at least one computing device, as a stand-alone software package, or it may be executed partly on one computing device and partly on a remote computer. In the latter scenario, the remote computer may be connected directly to the one computing device via a LAN or a WAN (for example, Intranet), or the connection may be made indirectly through an external computer (for example, through the Internet, a secure network, a sneaker net, or some combination of these).

It will be understood that each block of the flowchart illustrations and block diagrams and combinations of those blocks can be implemented by computer program instructions and/or means. These computer program instructions may be provided to a processor of at least one general purpose computer, special purpose computer(s), or other programmable data processing apparatus to produce a machine, such that the instructions, which execute via the processor of the computer or other programmable data processing apparatus, create means for implementing the functions specified in the flowcharts or block diagrams.

The exemplary and alternative embodiments described above may be combined in a variety of ways with each other. Furthermore, the steps and number of the various steps illustrated in the figures may be adjusted from that shown.

Although the present invention has been described in terms of particular exemplary and alternative embodiments, it is not limited to those embodiments. Alternative embodiments, examples, and modifications which would still be encompassed by the invention may be made by those skilled in the art, particularly in light of the foregoing teachings.

The invention claimed is:

1. A portable device, comprising:
   a battery comprising at least two battery banks and at least one spare bank;
   a sensor for monitoring the status of the at least two battery banks;
   a connecting controller for reconfiguring a connection schema of the battery to replace a problem bank with an extra or spare bank; and
   a discharge/exercise controller for controlling the rate of discharge and recharge of the problem bank,
   wherein the connecting controller comprises a computing resource profile comprising a model based upon at least one of actual usage of the portable device, a required level of power consumption, or a chosen level of power consumption.

2. A portable device according to claim 1, wherein the portable device comprises a computer laptop.

3. A portable device according to claim 1, wherein the portable device comprises a cell phone, an MP3 player, a television, a personal digital assistant, or a tool.

4. A portable device according to claim 1, wherein the connecting controller comprises a computing resource profile comprising a model based upon actual usage of the portable device.

5. A portable device according to claim 1, wherein the connecting controller comprises a computing resource profile comprising a model based upon a required level of power consumption.

6. A portable device according to claim 1, wherein the connecting controller comprises a computing resource profile comprising a model based upon a chosen level of power consumption.

7. A portable device, comprising:
   a battery comprising at least two battery banks and at least one spare bank;
   a sensor for monitoring the status of the at least two battery banks;
   a connecting controller for reconfiguring a connection schema of the battery to replace a problem bank with at least one spare bank; and
   a discharge/exercise controller for controlling the rate of discharge and recharge of the problem bank,
   wherein the connecting controller comprises a computing resource profile comprising a model based on one selected from the group consisting of actual usage of the portable device, a required level of power consumption, and a chosen level of power consumption.

8. A portable device according to claim 7, wherein the connecting controller comprises a computing resource profile comprising a model based upon actual usage of the portable device.

9. A portable device according to claim 7, wherein the connecting controller comprises a computing resource profile comprising a model based upon a required level of power consumption.

10. A portable device according to claim 7, wherein the connecting controller comprises a computing resource profile comprising a model based upon a chosen level of power consumption.

11. A portable device according to claim 7, wherein the portable device comprises a cell phone or an MP3 player.

12. A portable device according to claim 7, wherein the battery banks comprise at least one of nickel cadmium or nickel metal hydride batteries.

13. A portable device according to claim 7, wherein the battery banks comprise lithium batteries.

14. A portable device according to claim 7, wherein the battery banks comprise lead-acid batteries.

* * * * *